United States Patent
Chen et al.

(10) Patent No.: US 6,399,486 B1
(45) Date of Patent: Jun. 4, 2002

(54) METHOD OF IMPROVED COPPER GAP FILL

(75) Inventors: Sheng-Hsiung Chen, Taichung; Ming-Hsing Tsai, Taipei, both of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/442,313

(22) Filed: Nov. 22, 1999

(51) Int. Cl.[7] .................................................. H01L 21/44
(52) U.S. Cl. ........................................ 438/660; 438/646
(58) Field of Search ................................ 438/618, 646, 438/660

(56) References Cited

U.S. PATENT DOCUMENTS

| | | | |
|---|---|---|---|
| 5,849,367 A | 12/1998 | Dixit et al. | 427/535 |
| 5,866,478 A | 2/1999 | Linliu | 438/660 |
| 5,891,804 A | 4/1999 | Havemann et al. | 438/674 |
| 5,895,274 A | 4/1999 | Lane et al. | 438/795 |
| 5,913,146 A | 6/1999 | Merchant et al. | 438/646 |
| 5,926,736 A * | 7/1999 | deSilva | 438/637 |
| 6,174,812 B1 * | 1/2001 | Hsiung et al. | 438/687 |

OTHER PUBLICATIONS

Dixit et al., "A Novel High Pressure Low Temperature Aluminum Plug Technology for Sub–O.5. micron Contact/Via Geometries", Proceedings of IEDM 1994, pp. 105–108.

Jongste et al., "High Pressure Aluminium for Sub–micron Vias using a Liquid Transducer", Materials for Advanced Metallization, 1997, pp. 84–85.
J. Torres Cu Dual Damascene for Advanced Metallisation Jun. 1999 IEEE pp. 253255.*

* cited by examiner

Primary Examiner—Olik Chaudhuri
Assistant Examiner—David S Blum
(74) Attorney, Agent, or Firm—George O. Saile; Stephen B. Ackerman

(57) ABSTRACT

The present invention teaches a special annealing process to "heal" electrochemical copper deposited (ECD) defects in a dual damascene via and trench structure. The annealing step is processed after the electrochemical deposition (ECD) of the top excess copper and before the chemical mechanical polishing (CMP) of the copper. The key processing steps of this invention are the special annealing steps at key temperatures, ambients, pressures and times to anneal out the defective copper voids in the dual damascene structure. These annealing conditions are special annealing steps to promote low temperature copper surface diffusion to "heal" the voids and other defectives within the copper trench and via structure. The special annealing conditions of: temperature, ambient, pressure and time are the following: temperature in a range of about 300 to 500° C., ambient of nitrogen $N_2$, hydrogen $H_2$ gases (reducing atmosphere to remove copper oxide, $N_2/H_2$ plasma preferred), pressure in a range of about 100 MPa to 600 MPa, time in a range of about 0.5 to 10 minutes. These conditions are designed to take advantage of low temperature surface diffusion mechanisms.

36 Claims, 3 Drawing Sheets

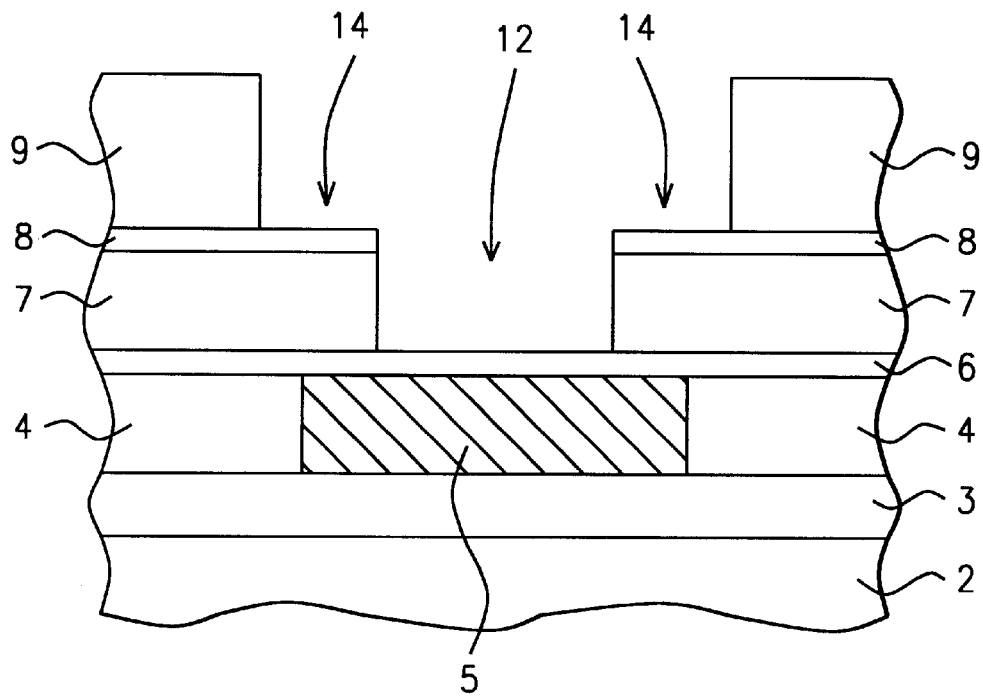
FIG. 1 – Prior Art
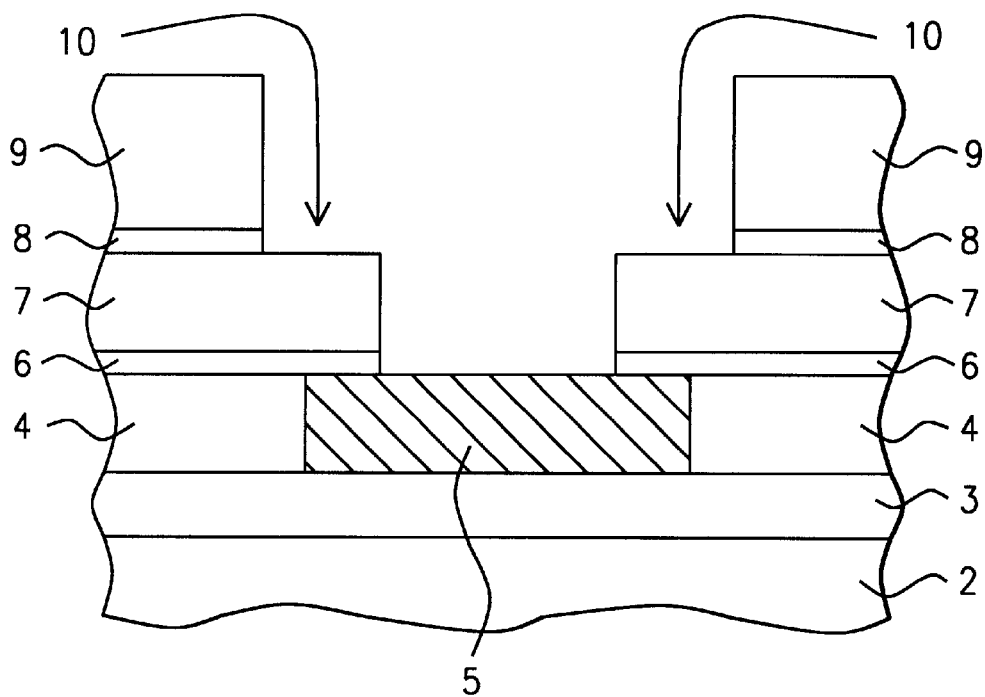
FIG. 2 – Prior Art

METHOD OF IMPROVED COPPER GAP FILL

BACKGROUND OF THE INVENTION

(1) Field of the Invention

The present invention teaches a method of electrochemical copper deposition (ECD) in dual damascene trench and via with high pressure and special annealing conditions to solve the void, electrolyte trapping problems and other defects associated with the ECD technique.

(2) Description of Related Art

The electrochemical copper deposition (ECD) has been adopted as the "standard" fill process for copper metallization because of its larger grain size (good electromigration) and high deposition rates. However, the ECD process is a wet process and causes void formation in the via or trench. Also, the electrolyte can also be trapped in the voids causing reliability problems. The conventional method is to anneal the copper film under atmospheric pressures or less. However, the voids are not eliminated during these conventional annealing processes. Similar to aluminum annealing processes, a high pressure and temperature "force fill" method is taught by this invention, to improve copper reliability. The present invention teaches a method for forming an electrochemical copper deposition (ECD) via and trench by using special high pressure, 100 to 600 MPa, and temperature annealing 300 to 500° C.

As a background to the current invention, the damascene process is a "standard" method for fabricating planar copper interconnects. Damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices. In both examples, sputtered Ti/TiN liners have been coated with chemical vapor deposited (CVD) W metal, then polished back to oxide.

Sputter deposition has some advantages as a metal deposition technique because it can be used to deposit many conductive materials, at high deposition rates, with good uniformity and low cost of ownership. Conventional sputtering fill is poorer for deeper, narrower (high-aspect-ratio) features. In addition, fill is especially bad for corners of recesses, which have relatively small acceptance angles for flux, and for thick depositions, since the upper surface deposition can block incoming flux and produce a void in the recessed feature.

The fill factor by sputter deposition has been improved by collimating the sputtered flux. Typically, this is achieved by inserting between the target and substrate a collimator plate having an array of hexagonal cells.

Chemical vapor deposition (CVD) of W usually requires an underlying conductive barrier and "seed" layers to prevent consumption of substrate Si from reaction with $WF_6$ at the contact level, and to promote distributed nucleation and low contact resistance. A layer of Ti is used since it provides good adhesion and low contact resistance. However, the Ti alone is not sufficient, because the F from the $WF_6$ reacts with the Ti and produces a brittle, high-resistivity compound. However, the use of a TiN film between the Ti and W solves these problems by enhancing W nucleation while preventing the reaction of F with the Ti or any exposed Si. A W seed layer is then formed on the TiN.

After deposition, CMP is applied to complete the inlaid structure. In the CMP process, material is removed from the wafer through the combined effects of a polish pad and an abrasive slurry. The chemical dissolution of material is aided by a mechanical component which is useful in removing passivating surface layers. Chemical and mechanical selectivity's between materials are desired, since CMP must remove the excess metal without removing appreciable amounts of inlaid metal or reducing interconnect thickness.

In the dual-damascene process, a monolithic stud/wire structure is formed from the repeated patterning of a single thick oxide film followed by metal filling and CMP. First, a relatively thick oxide layer is deposited on a planar surface. The oxide thickness is slightly larger than the desired final thickness of the stud and wire, since a small amount of oxide is removed during CMP. Stud recesses are formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes.

Next, the stud/wire metallization is deposited, then planarized using CMP. The resulting interconnects are produced with fewer process steps than with conventional processing and with the dual damascene process, two layer of metal are formed as one, i.e., wiring line and contact stud vias, avoiding an interface between the layers.

The dual-damascene process can be more difficult to fill and planarize than the single-damascene processing. Specifically, the metal films must now fill features having aspect ratios much greater than 1. This can be attained with CVD W, provided the adhesive liner covers the recessed surfaces. To obtain adequate liner coverage using collimated sputtered (PVD) Ti/TiN liners, a larger liner thickness must be applied, which is then difficult to polish away, without dishing (W dishing due to its easy removal by CMP). Furthermore, the conformal filling afforded by CVD W results in local recesses over the high-aspect-ratio dual-damascene features that contribute to dishing during polishing.

Another metal deposition has been adapted as a standard for copper metallization. This technique is electrochemical copper deposition (ECD). It is used for the large grain size (low electromigration) and high deposition rates achieved. The electrochemical copper deposition (ECD) still needs sputtering techniques, physical vapor deposition (PVD), to deposit thin barrier film (Ta, TaN) and a conductive "seed" layer of copper. However, the electrochemical copper deposition (ECD) process is a wet process. The process causes some void formation in the via and trench, as the copper is electroplated and grows from all sides onto the seed layer. In addition, the electrolyte is easily trapped in the voids. These deleterious effects with electrochemical copper deposition (ECD) usually cause reliability problems. The conventional method to solve these problems of voids and trapped electrolyte is to anneal the copper film under atmospheric pressure or less. However, the voids cannot be completely eliminated during these conventional annealing processes.

Related patents and relevant literature now follow as Prior Art.

U.S. Pat. No. 5,891,804 (Havemann et al.) teaches a copper electrolysis process. In an embodiment, a sputtered metal layer is formed and is subjected to a metal reflow or extrusion process. The sputtered metal is by high density plasma (HDP) and is followed by temperatures of between 300 to 600° C. and high pressures. This process is a method of forming a conductor on an interlevel dielectric layer which is over an electronic microcircuit substrate, and the structure produced thereby. The method utilizes: forming an intralevel dielectric layer over the interlevel dielectric layer; forming a conductor groove in the intralevel dielectric layer exposing a portion of the interlevel dielectric layer; anisotropically depositing a selective deposition initiator onto the intralevel dielectric layer and onto the exposed portion of the interlevel dielectric layer; and selectively depositing conductor metal to fill the groove to at least half-full. The selective deposition initiator may selected from the group consisting of tungsten, titanium, palladium, platinum, copper, aluminum, and combinations thereof. In one embodiment, the selective deposition initiator is palladium, and the selectively deposited conductor metal is principally copper.

U.S. Pat. No. 5,849,367 (Dixit et al.) discloses an aluminum forcefill anneal process. An elemental titanium-free liner and cavity cleansing process is provided that allows for the elimination of conventional sputter etch and elemental titanium depositions. A low power plasma etch provides for pre-conditioning/cleansing of cavities such as contacts and vias. A refractory metal is provided as a cavity liner. Preferably, the liner is comprised of several discrete refractory metal liner layers, each having a thickness of about 25–100 Angstroms, that can be applied by CVD and/or PVD. A low power plasma cleanse is preferably interposed between each liner layer deposition. A suitable metal plug can be deposited and directed into the cavity to complete cavity filling. Preferably, the metal plug is an elemental aluminum or aluminum alloy plug that is deposited by CVD and force-filled into the cavity to reduce the incidence of micro-voids within the cavity. Elimination of the conventional sputter etch and the high temperature processing (temp.$\geq$~400° C.) associated with such processing allows for the use of polymeric dielectrics, such as the family of polytetrafluorethylene ("PTFE") compounds, which exhibit a dielectric constant (K) of about 1.9; parylene (K=~2.2–2.6); aerogels and xerogels (K=~1.1–1.8); and the family of polymeric spin-on-glass ("SOG") materials; use of all the foregoing materials being attractive because of the ability of these materials to reduce parasitic capacitance of the interconnects. Because these polymeric materials are temperature sensitive, their use has been limited, as conventional device fabrication practices typically require operation temperatures far in excess of the melting and/or decomposition temperature for these materials.

U.S. Pat. No. 5,895,274 (Lane et al.) shows a high pressure anneal process in $H_2$ and an inert gas. This invention embodies an improved process for annealing integrated circuits to repair fabrication-induced damage. An integrated circuit is annealed in a pressurized sealed chamber in which a forming gas comprising hydrogen and nitrogen is present. Pressurization of the chamber reduces the contribution made by the final anneal step to total thermal exposure by increasing the diffusion rate of the hydrogen into the materials from which the integrated circuit is fabricated. Ideally. the forming gas contains, in addition to hydrogen, at least one other gas such as nitrogen or argon that will not react with hydrogen and, thus, reduce the danger of explosion. However, the integrated circuit may be annealed in an ambiance containing only hydrogen gas that is maintained at a pressure greater than ambient atmospheric pressure.

U.S. Pat. No. 5,866,478 (Linliu) shows a "forcefill" at a low temperature by using an artificial gravity instead of gas pressure. Voids in via holes in integrated circuits have been effectively removed by heating the vias to a relatively low temperature and then subjecting the entire structure (including the vias) to artificial gravitational forces. Said forces may be steadily applied, as in centrifuging, or they may be applied intermittently by using a jerking motion which is repeated several times. A number of different ways for implementing such jerking motion are described. These include magnetic repulsion, vertical pulling by a motor, and providing a pressure differential between the top and bottom sides of the integrated circuit holder.

U.S. Pat. No. 5,913,146 (Merchant et al.) shows a low pressure aluminum reflow process. A semiconductor device and a method of manufacturing thereof is described. The semiconductor device includes: (1) a substrate having a recess therein, (2) an aluminum-alloy layer located over at least a portion of the substrate and filling at least a portion of the recess and (3) a protective metal layer at least partially diffused in the aluminum-alloy layer, the metal protective layer having a high affinity for oxygen and acting as a sacrificial target for oxygen during a reflow of the aluminum-alloy layer.

"A Novel High Pressure Low Temperature Aluminum Plug Technology For Sub-0.5 micron Contact/Via Geometries", by Dixit et al., Proceedings of IEDM 1994, p 105–108 is cited. Several recent papers have demonstrated aluminum reflow for contact/via filling in 0.5 micron applications. However, aluminum reflow processes have not been widely accepted due to the higher deposition temperatures required and the difficulty in globally filling the high aspect ratio contacts and vias of ULSI circuits. Global filling is of particular concern for sub-0.5 micron applications, since a viable aluminum reflow technology must be capable of achieving equivalent or better yield and reliability as compared to conventional tungsten plug technology. Yield and reliability results presented in this paper demonstrate that enhanced aluminum fill at temperatures less than 450° C. is indeed a viable process for sub-0.5 micron applications.

"High Pressure Aluminum for Sub-micron Vias using a Liquid Transducer", by Jongste et al., Materials for Advanced Metallization, 1997, p. 84–85 is cited. Recently, high pressure via-fill has been developed as a new method to manufacture ULS1 sub-micron diameter Al contacts with a high aspect ratio. In this paper the fabrication of sub-micron Al vias using silicon oil (polymethylsiloxane) at high pressures is investigated. The high pressure via-fill process is performed on sub-micron diameter contacts patterned in $SiO_2$ on Si(100) and covered with a hot-sputtered bridging AlCu(0.5%)Si(1%) film on a Ti/TiN barrier layer. During the process samples are heated to a temperature in the range of 250–400° C. and pressurized between 60 and 200 MPa using silicon oil as a transducer. It is found that in this temperature and pressure range contact-fill is possible. An SEM cross-section of a contact (0.6 micron diameter) is shown before and after processing at 280° C. and 80 MPa for 16 mm. The relation between pressure, temperature and contact-fill of this high pressure extrusion process is discussed. To investigate the mechanism of the extrusion process, the time dependence of the contact-fill is measured at low temperature as a function of process time. The results indicate that the kinetics of the via-fill process follow Arrhenius' law. The limiting step of the via-fill process can be described by steady state flow of Al. An activation energy of 290 kJ/mol is found.

SUMMARY OF THE INVENTION

The present invention teaches a method of electrochemical copper deposition (ECD) with high pressure and special annealing condition to solve the aforementioned void and electrolyte trapping problems associated with the ECD technique.

As background and provided by Prior Art methods to the present invention, is a semiconductor substrate with a an insulating layer thereon. A copper metal interconnect is provided and patterned within an insulating layer, ie, ($SiO_x$) In addition, two layers of insulating dielectric ($SiO_x$) are deposited and patterned to form a via and trench region opening. Also provided by Prior Art methods, are both a via etch stop layer and trench etch stop layer, e.g., silicon oxy-nitride, SiON, which lines the trench and via region. These Prior Art method provide a basic dual damascene structure.

Next in the process, as background and provided by Prior Art methods to the present invention, is the etch back and removal by dry etch, reactive ion etch (RIE), of the etch stop layers in the exposed via and trench regions. However, some microscopic defects (too small to illustrate in FIGS.) occur on the surface of the insulator layer (the trench stop layer), as a direct result of the removal of the etch stop/liner material. These deleterious microscopic defects can later cause reliability problems in the interconnect metallurgy (opens) and cause electromigration problems. These defects can by caused by re-sputtering (too thin to be shown in FIGS.) within the trench/via region, which causes problems in the subsequent electrochemical copper deposition process. These defects are referred later on in the present invention.

The next processing step in building of the dual damascene structure, is the deposition by sputtering (PVD, physical vapor deposition) and patterning of a thin metal barrier layer (trench liner), e.g. Ta, TaN, and thin copper seed layer, for subsequent electrochemical copper deposition (ECD), which occurs as the next process step in the sequence of process steps.

The next processing step in building of the dual damascene structure, is the deposition of copper upon the seed layer, by electrochemical copper deposition (ECD). However, with the copper growing out from solution, electrolyte, the sidewalls of the via and trench form seams and voids in the via and trench region, (trapping liquid electrolyte). These voids and defects form as a direct result of the geometry's of the via and trench and growth kinetics of the electrochemical copper deposition process. It is these aforementioned defects, in ECD fill of the dual damascene structures, that the present invention addresses and provides solutions to these process problems.

The key embodiments of the present invention are now presented and occur (take place) after electrochemical deposition (ECD) of the top copper. The key processing steps of this invention are the special annealing steps at key temperatures, ambient, pressures and times to anneal out the defective copper dual damascene structure. These annealing conditions are special annealing steps to promote low temperature copper surface diffusion to "heal" the voids and other defectives within the copper trench and via structure. The special annealing conditions of: temperature, ambient, pressure and time are the following: temperature in a range of about 300 to 500° C., ambient of nitrogen $N_2$, hydrogen $H_2$ gases (reducing atmosphere to remove copper oxide, $N_2/H_2$ plasma preferred), pressure in a range of about 100 Mpa to 600 Mpa, time in a range of about 0.5 to 10 minutes. These conditions are designed to take advantage of low temperature surface diffusion mechanisms. Bulk copper diffusion distance is: the square root of (Dt), where D is the diffusion coefficient and t is the time. Bulk diffusion of copper becomes significant at higher temperatures, about two-thirds of pure copper's melting point, which is 1083° C. (copper alloys lower the melting point). As mentioned above, the conditions of the present invention favor low temperature, high pressure surface diffusion mechanisms to anneal out the aforementioned surface defects on the trench etch stop layer, seams and voids within the electrochemical deposited copper, and any entrapped electrolyte. In addition, annealing the copper interconnect improves the electromigration reliability of the interconnects.

The final processing step in building of the dual damascene structure, is the chemical mechanical polishing (CMP) back of the excess electrochemical deposited copper metal after the special annealing treatment. The copper is chemmech polished and planarized with the surface without dishing.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1, which in cross-sectional representation, illustrates Prior Art methods, as background to the present invention, forming a dual damascene structure of via and trench over a copper metal interconnect.

FIG. 2, which illustrated in cross-sectional drawing, is the etch back and removal by dry etch, reactive ion etch (RIE), of the etch stop layers (creating some defect regions).

DESCRIPTION OF THE PREFERRED EMBODIMENTS

Figure 3:
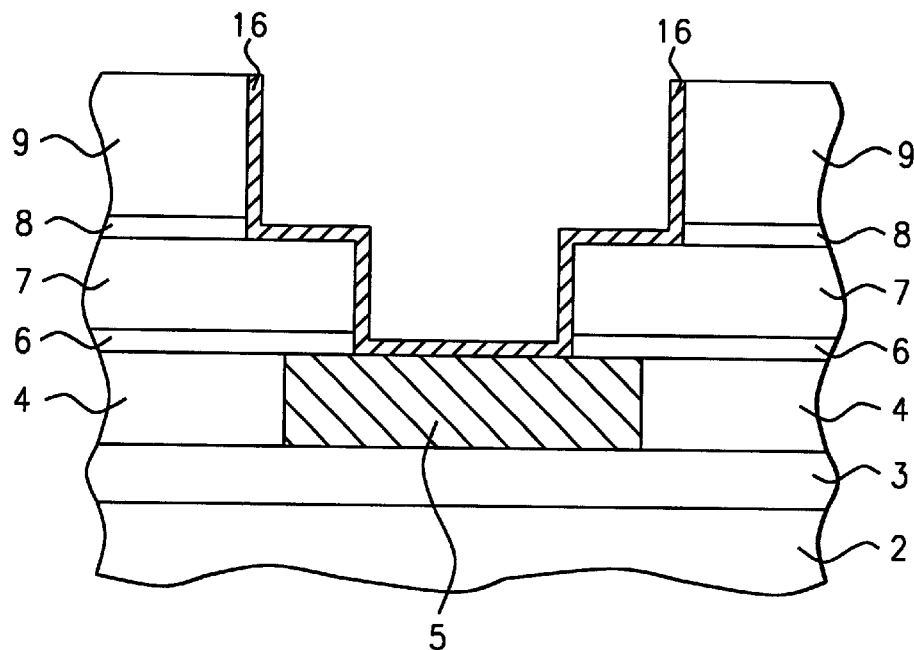
FIG. 3, which illustrated in cross-sectional drawing, is the next processing step in building of the dual damascene structure, the deposition and patterning of a thin metal barrier layer (trench liner) and thin copper seed layer.

The new and improved method of annealing electrochemical copper deposition (ECD), similar to aluminum annealing processes, a high pressure and temperature "force fill" method is taught by this invention to improve copper reliability. The present invention teaches a method for forming an electrochemical copper deposition (ECD) via and trench by using special high pressure (100 to 600 Mpa) and temperature annealing (300 to 500° C.).

Referring to FIG. 1 illustrated in cross-sectional drawing, as background and provided by Prior Art methods to the present invention, is a semiconductor substrate 2 with a an insulating layer 3. A copper metal interconnect 5 is shown patterned within an insulating layer 4, ie, $SiO_x$. In addition, two layers of dielectric 7 and 9 ($SiO_x$) are deposited and patterned with via 12 and trench 14 opening. Also provided by Prior Art methods, are via etch stop layer 6 and trench etch stop layer 8, e.g., silicon oxy-nitride, SiON, which lines the trench and via region in FIG. 1. These Prior Art method provide the dual damascene structure shown in the figures.

Referring to FIG. 2 illustrated in cross-sectional drawing, as background and provided by Prior Art methods to the present invention, is the etch back and removal by dry etch, reactive ion etch (RIE), of the etch stop layers 6 and 8 in the exposed via and trench regions. However, some microscopic defects 10 (too small to illustrate in FIGS.) occur on the surface of the insulator layer 7, as a direct result of the removal of the etch stop/liner material. These deleterious microscopic defects 10 can later cause reliability problems in the interconnect metallurgy (opens) and cause electromigration problems. These defects can by caused by re-sputtering (too thin to be shown in FIGS.) within the trench/via region, which causes problems in the subsequent electrochemical copper deposition process. These defects are referred to later on in the present invention.

Referring to FIG. 3 illustrated in cross-sectional drawing, the next processing step in building of the dual damascene structure, the deposition by sputtering (PVD, physical vapor deposition) and patterning of a thin metal barrier layer (trench liner), e.g. Ta, TaN, and thin copper seed layer 16, for subsequent electrochemical copper deposition (ECD), which occurs as the next process step in the sequence of process steps. Barrier layer deposition conditions are physical vapor deposition (PVD) DC reactive sputtering with $Ar,N_2$ gases, pressure from about 10 to 500 mTorr, power from about 100 to 2,000 Watts, deposition rates from 100 to 2,000 Angstroms/min, with a film thickness range from 500 to 3,000 Angstroms. Similar deposition conditions are used for the seed layer except: Ar gas sputtering, deposition rates from about 100 to 2,000 Angstroms/min, with film thickness range from 500 to 3,000 Angstroms.

Figure 4:
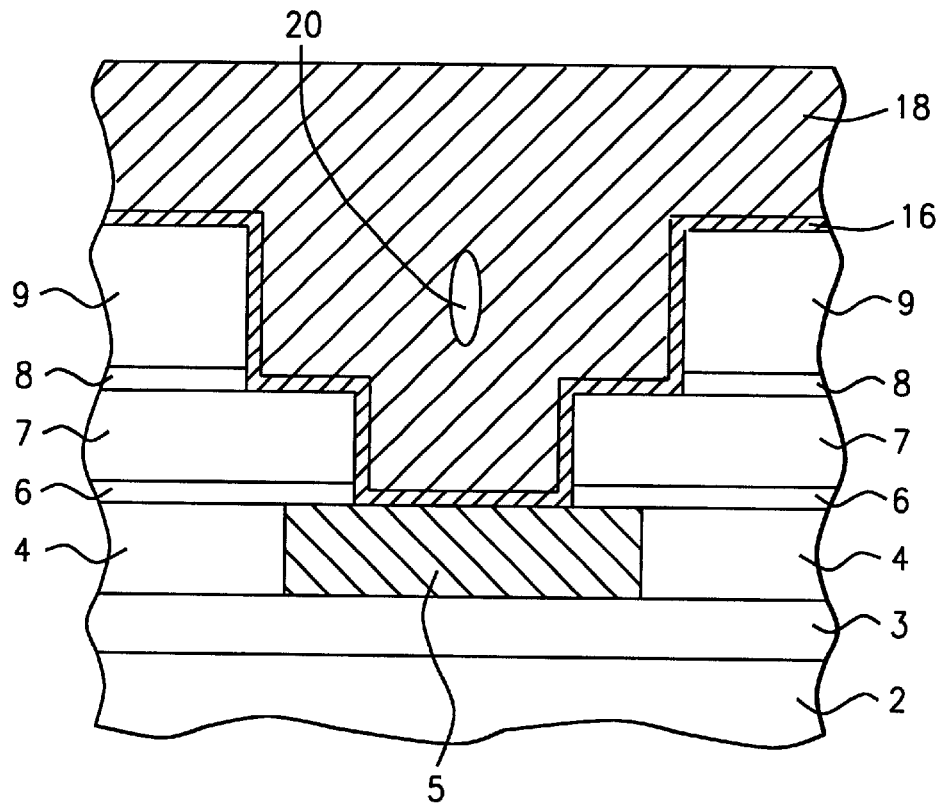
FIG. 4, which illustrated in cross-sectional drawing, is the next processing step in building of the dual damascene structure, the deposition of copper upon the seed layer by electrochemical copper deposition (ECD) and void formation.

Referring to FIG. 4 illustrated in cross-sectional drawing, the next processing step in building of the dual damascene structure, the deposition of copper 18 upon the seed layer 16, by electrochemical copper deposition (ECD). However, with the copper growing out from solution, electrolyte, the sidewalls of the via and trench form seams and voids (20) in the via and trench region, (trapping liquid electrolyte). These voids and defects (20) form as a direct result of the geometry's of the via and trench and growth kinetics of the electrochemical copper deposition process. It is these aforementioned defects, in ECD fill of the dual damascene structures, that the present invention addresses and provides solutions to these process problems. Electrochemical deposition (ECD) of copper deposition condition details are: temperature from 10 to 30° C., deposition rate from 2,000 to 5,000 Angstroms/min, copper thickness from 3,000 to 20,000 Angstroms, Cu grain size from 0.5 to 3 microns, Cu crystal preferred orientation (111), re-crystallization near room temperature, 20° C., and defects or voids size diameter about 0.05 to 0.2 microns.

Figure 5:
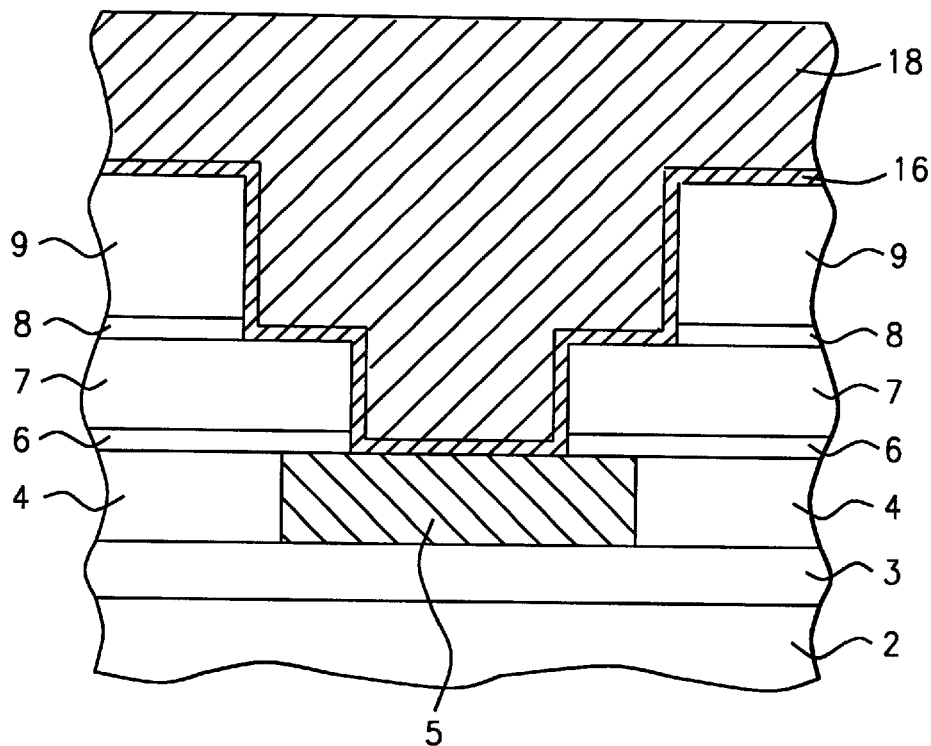
FIG. 5, which illustrated in cross-sectional drawing, shows the key embodiments of the present invention, the special annealing of temperature, ambient, pressure and time to "heal" the voids and other defectives within the copper trench and via structure.

Referring to FIG. 5 illustrated in cross-sectional drawing, the result of the key embodiments of the present invention. After the electrochemical deposition (ECD) of the top copper 18, the key processing steps of this invention take place. The defective copper dual damascene structure is specially annealed to promote low temperature copper surface diffusion to "heal" the voids and other defectives within the copper trench and via structure. The special annealing conditions of: temperature, ambient, pressure and time are the following: temperature in a range of about 300 to 500° C., ambient of nitrogen $N_2$, hydrogen $H_2$ gases (reducing atmosphere to remove copper oxide, $N_2/H_2$ plasma preferred), pressure in a range of about 100 Mpa to 600 Mpa, time in a range of about 0.5 to 10 minutes. These conditions are designed to take advantage of low temperature surface diffusion mechanisms. Bulk copper diffusion distance is: the square root of (Dt), where D is the diffusion coefficient and t is the time. Bulk diffusion of copper becomes significant at higher temperatures, about two-thirds of pure copper's melting point, which is 1083° C. (copper alloys lower the melting point). As mentioned above, the conditions of the present invention favor low temperature, high pressure surface diffusion mechanisms to anneal out the aforementioned surface defects on the trench etch stop layer, seams and voids within the electrochemical deposited copper, and any entrapped electrolyte. In addition, annealing the copper interconnect improves the electromigration reliability of the interconnects. More process details of the special annealing conditions of this invention are: time for annealing steps range from about 0.5 to 10 minutes, with gas compositions of $N_2/H_2$, ranging from 100 to 1 ratio, nitrogen to hydrogen gas, to from one part to one part of each gas.

The mechanisms of present patent annealing conditions are similar to those reported for aluminum, wherein it is demonstrated that the application of high pressure assists in the production of a high density material. The high pressure increases the driving force for densification. The driving force an aluminum flow process is the reduction in surface area to minimize surface energy. To complete the fill of contact windows with aspect ratio >1, the wafer needs to be heated about 550° C. for about 3 minutes, which is near the melting point for Al. It is at these high temperatures that significant bulk diffusion of Al occurs. However, the key point is that in these processes, most of the mass transport occurs through surface diffusion (lower temperature processes) and can therefore be processed at lower temperatures (for Al at about 50 to 100° C.). Similar processes and surface diffusion mechanisms apply to electrochemical deposited copper, as utilized by this invention.

Figure 6:
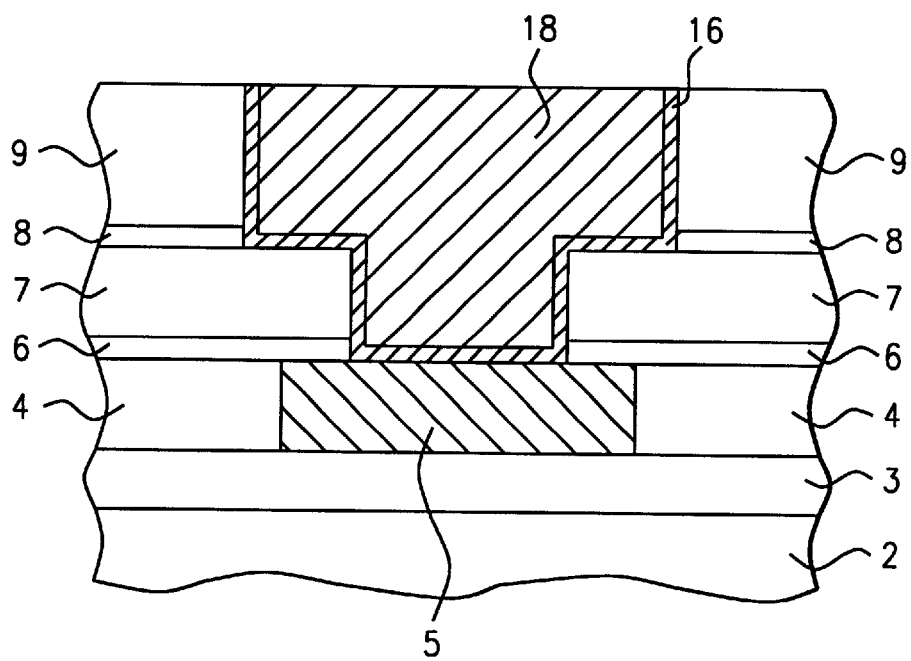
FIG. 6, which illustrated in cross-sectional drawing, is the chemical mechanical polishing (CMP) back of the excess copper metal, without void defects.

Referring to FIG. 6 illustrated in cross-sectional drawing, the final processing step in building of the dual damascene structure, the chemical mechanical polishing (CMP) back of the excess electrochemical deposited copper metal 18, without the void type defects within the structure. After the special annealing treatment, the copper is planarized with the surface and chem-mech polished back without dishing, along with the associated seed layer/barrier layer 16.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit on a substrate with dual damascene, method comprising:
   providing a substrate or substrate module;
   providing a substrate having a layer of dielectric, inter-level dielectric (ILD), or an interconnect line;
   providing a first level of conducting wiring being defined and embedded in a first layer of insulator;
   depositing (blanket) of a first etch stop barrier;
   depositing (blanket) of the first intermetal dielectric layer (IMD) over first etch stop barrier;

depositing (blanket) of a second etch stop barrier; layer over the first intermetal dielectric layer;

depositing (blanket) of a second intermetal dielectric layer (IMD) over second etch stop barrier;

patterning and etching dielectric layers forming dual damascene via/trench and interconnect structures;

etching selectively to remove exposed etch stops;

depositing and patterning channel and via barrier liner material and copper seed layer;

depositing by electrochemical copper deposition (ECD) conducting material;

annealing by temperatures, 300 to 500° C., pressures 100 to 600 MPa, ambient of $N_2/H_2$, and times (0.5–10 minutes) to remove conducting copper seams, voids and entrapped electrolyte;

polishing back by chemical mechanical polishing (CMP) the excess void-free said conducting copper metal.

2. The method of claim 1, wherein said substrate is semiconductor single crystal silicon or an IC module.

3. The method of claim 1, wherein said layers of etch stop barriers are low dielectric films, comprising of refractory materials, i.e., silicon nitride and silicon oxynitride with very different etch properties than silicon oxide for selective etching and act as etch stop barriers.

4. The method of claim 1, wherein both dielectric layers or intermetal dielectric layers (IMD) are composed of silicon dioxide or silicon oxide.

5. The method of claim 1, wherein the trench or channel and said via hole contact comprises a diffusion barrier liner, which also aids adhesion, deposited by sputtering (PVD), liner type materials comprised of, e.g., Ta, TaN, thickness from 100 to 1,000 Angstroms.

6. The method of claim 1, wherein the trench or channel and said via hole contact comprises a copper seed layer liner, deposited by sputtering (PVD), seed type materials comprised of, e.g., thin Cu, thickness from 4,000 to 40,000 Angstroms.

7. The method of claim 1, wherein the conducting material layers for conducting interconnect lines and said via contacts comprise the following conducting type materials: electrochemical copper deposition (ECD), upon the copper seed layer, ECD Cu thickness from 4,000 to 40,000 Angstroms.

8. The method of claim 1, wherein the said ECD copper is annealed at temperatures from about 300 to 500° C., pressures from about 100 to 600 MPa, ambient of $N_2/H_2$ gases or $N_2/H_2$ plasma, times of about 0.5 to 10 minutes, after electrochemical deposition (ECD) of conducting copper metal and before chemical mechanical polish (CMP) of said (ECD) conducting copper metal.

9. The method of claim 1, wherein the ECD copper by the said annealing is made more reliable by removing seams, voids and other defects.

10. The method of claim 1, wherein multilevel conducting structures are fabricating by repeating the process described herein.

11. The method of claim 1, wherein each level of conducting structure is planarized by removing excess conducting material, include planarization by chemical mechanical polish (CMP), milling, ion milling, and/or etching.

12. The method of claim 1, wherein conducting interconnect lines/via and interconnect structures are produced by this process, comprising a product with superior lines and via contact structures by annealing, hence improving reliability by decreasing: electromigration, seams, voids, entrapped electrolyte.

13. A method of fabricating an integrated circuit on a substrate with dual damascene structure using electrochemical copper deposition (ECD) and annealing, the method comprising:

providing a substrate or substrate module;

providing a substrate having a layer of dielectric, interlevel dielectric (ILD), silicon oxide, or a copper interconnect line;

providing a first level of copper conducting wiring being defined and embedded in a first layer of insulator, silicon oxide;

depositing (blanket) of a first etch stop barrier, silicon oxynitride SiON;

depositing (blanket) of the first intermetal dielectric layer (IMD), silicon oxide, over first etch stop barrier;

depositing (blanket) of a second etch stop barrier, silicon oxynitride SiON; layer over the first intermetal dielectric layer;

depositing (blanket) of a second intermetal dielectric layer (IMD), silicon oxide, over second etch stop barrier;

patterning and etching, by several process steps, the dielectric layers to form dual damascene via/trench and interconnect structures;

etching selectively to remove exposed etch stops;

depositing by sputtering and patterning channel and via barrier liner material, Ta, TaN;

depositing by sputtering and patterning a copper seed layer which lines the trench and via regions;

depositing by electrochemical copper deposition (ECD) copper conducting metal;

annealing by temperatures, 300 to 500° C., pressures 100 to 600 MP, ambient of $N_2/H_2$, and times (0.5–10 minutes) to remove conducting copper seams, voids and entrapped electrolyte;

polishing back by chemical mechanical polishing (CMP) the excess void-free said conducting copper metal, forming inlaid metal in the open areas to form conducting interconnects and contacts.

14. The method of claim 13, wherein said substrate is semiconductor single crystal silicon or an IC module.

15. The method of claim 13, wherein said layers of etch stop barriers are low dielectric films, comprising of refractory materials, i.e., silicon nitride and silicon oxynitride with very different etch properties than silicon oxide for selective etching and act as etch stop barriers.

16. The method of claim 13, wherein both dielectric layers or intermetal dielectric layers (IMD) are composed of silicon dioxide or silicon oxide.

17. The method of claim 13, wherein the trench or channel and said via hole contact comprises a diffusion barrier liner, which also aids adhesion, deposited by sputtering (PVD), liner type materials comprised of, e.g., Ta, TaN, thickness from 100 to 1,000 Angstroms.

18. The method of claim 13, wherein the trench or channel and said via hole contact comprises a copper seed layer liner, deposited by sputtering (PVD), seed type materials comprised of, e.g., thin Cu, thickness from 4,000 to 40,000 Angstroms.

19. The method of claim 13, wherein the conducting material layers for conducting interconnect lines and said via contacts comprise the following conducting type materials: electrochemical copper deposition (ECD), upon the copper seed layer, ECD Cu thickness from 4,000 to 40,000 Angstroms.

20. The method of claim 13, wherein the said ECD copper is annealed at temperatures from about 300 to 500° C., pressures from about 100 to 600 MPa, ambient of $N_2/H_2$ gases or $N_2/H_2$ plasma, times of about 0.5 to 10 minutes, after electrochemical deposition (ECD) of conducting copper metal and before chemical mechanical polish (CMP) of said (ECD) conducting copper metal.

21. The method of claim 13, wherein the ECD copper by the said annealing is made more reliable by removing seams, voids and other defects.

22. The method of claim 13, wherein multilevel conducting structures are fabricating by repeating the process described herein.

23. The method of claim 13, wherein each level of conducting structure is planarized by removing excess conducting material, include planarization by chemical mechanical polish (CMP), milling, ion milling, and/or etching.

24. The method of claim 13, wherein conducting interconnect lines/via and interconnect structures are produced by this process, comprising a product with superior lines and via contact structures by annealing, hence improving reliability by decreasing: electromigration, seams, voids, entrapped electrolyte.

25. A method of fabricating an integrated circuit on a substrate with dual damascene structure using electrochemical copper deposition (ECD) and annealing, for applications in MOSFET CMOS memory and logic, the method comprising:

providing a substrate or substrate module;

providing a substrate having a layer of dielectric, interlevel dielectric (ILD), silicon oxide, or a copper interconnect line;

providing a first level of copper conducting wiring being defined and embedded in a first layer of insulator, silicon oxide;

depositing (blanket) of a first etch stop barrier, silicon oxynitride SiON;

depositing (blanket) of the first intermetal dielectric layer (IMD), silicon oxide, over first etch stop barrier;

depositing (blanket) of a second etch stop barrier, silicon oxynitride SiON; layer over the first intermetal dielectric layer;

depositing (blanket) of a second intermetal dielectric layer (IMD), silicon oxide, over second etch stop barrier;

patterning and etching, by several process stops, the dielectric layers to form dual damascene via/trench and interconnect structures;

etching selectively to remove exposed etch stops;

depositing by sputtering and patterning channel and via barrier liner material, Ta, TaN;

depositing by sputtering and patterning a copper seed layer which lines the trench and via regions;

depositing by electrochemical copper deposition (ECD) copper conducting metal;

annealing by temperatures, 300 to 500° C., pressures 100 to 600 MP, ambient of $N_2/H_2$, and times (0.5–10 minutes) to remove conducting copper seams, voids and entrapped electrolyte;

polishing back by chemical mechanical polishing (CMP) the excess void-free said conducting copper metal, forming inlaid metal in the open areas to form conducting interconnects and contacts producing robust copper conducting structures for electronic applications.

26. The method of claim 25, wherein said substrate is semiconductor single crystal silicon or an IC module.

27. The method of claim 25, wherein said layers of etch stop barriers are low dielectric films, comprising of refractory materials, i.e., silicon nitride and silicon oxynitride with very different etch properties than silicon oxide for selective etching and act as etch stop barriers.

28. The method of claim 25, wherein both dielectric layers or intermetal dielectric layers (IMD) are composed of silicon dioxide or silicon oxide.

29. The method of claim 25, wherein the trench or channel and said via hole contact comprises a diffusion barrier liner, which also aids adhesion, deposited by sputtering (PVD) and reactive sputtering, liner type materials comprised of, e.g., Ta, TaN, thickness from 100 to 1,000 Angstroms.

30. The method of claim 25, wherein the trench or channel and said via hole contact comprises a copper seed layer liner, deposited by sputtering (PVD), seed type materials comprised of, e.g., thin Cu, thickness from 4,000 to 40,000 Angstroms.

31. The method of claim 25, wherein the conducting material layers for conducting interconnect lines and said via contacts comprise the following conducting type materials: electrochemical copper deposition (ECD), upon the copper seed layer, ECD Cu thickness from 4,000 to 40,000 Angstroms.

32. The method of claim 25, wherein the said ECD copper is annealed at temperatures from about 300 to 500° C., pressures from about 100 to 600 MPa, ambient of $N_2/H_2$ gases or $N_2/H_2$ plasma compositions of 100/1 to 1/1 gas ratios, times of about 0.5 to 10 minutes, after electrochemical deposition (ECD) of conducting copper metal and before chemical mechanical polish (CMP) of said (ECD) conducting copper metal.

33. The method of claim 25, wherein the ECD copper by the said annealing is made more reliable by removing seams, voids and other defects.

34. The method of claim 25, wherein multilevel conducting structures are fabricating by repeating the process described herein.

35. The method of claim 25, wherein each level of conducting structure is planarized by removing excess conducting material, include planarization by chemical mechanical polish (CMP), milling, ion milling, and/or etching.

36. The method of claim 25, wherein conducting interconnect lines/via and interconnect structures are produced by this process, comprising a product with superior lines and via contact structures by annealing, hence improving reliability by decreasing: electromigration, seams, voids, entrapped electrolyte.

* * * * *